United States Patent [19]

Condon et al.

[11] Patent Number: 4,875,409
[45] Date of Patent: Oct. 24, 1989

[54] MAGNETIC PRINT HAMMER ACTUATOR PROTECTION CIRCUIT

[75] Inventors: David C. Condon, Mission Viejo; David M. Stumfall, Santa Ana, both of Calif.

[73] Assignee: Printronix, Inc., Irvine, Calif.

[21] Appl. No.: 68,345

[22] Filed: Jul. 1, 1987

[51] Int. Cl.[4] .............................................. B41J 9/38
[52] U.S. Cl. .................... 101/93.29; 400/54; 400/74; 400/157.2; 324/73 AT; 307/270
[58] Field of Search ................ 400/54, 74, 159.2, 704; 101/93.03, 93.04, 93.29; 324/73 AT, 73 R; 307/270; 361/152-154

[56] References Cited

U.S. PATENT DOCUMENTS

| | | | |
|---|---|---|---|
| 3,941,051 | 3/1976 | Barrus | 400/121 X |
| 4,405,922 | 9/1983 | Nishino | 340/825.36 |
| 4,485,425 | 11/1984 | Gruner | 400/157.2 X |
| 4,637,742 | 1/1987 | Sakai | 101/93.29 X |
| 4,674,897 | 6/1987 | West | 400/157.2 X |
| 4,706,561 | 11/1987 | Greer | 400/54 X |

FOREIGN PATENT DOCUMENTS

| | | | |
|---|---|---|---|
| 108974 | 7/1982 | Japan | 400/54 |
| 134774 | 8/1983 | Japan | 400/54 |
| 2570 | 1/1986 | Japan | 400/54 |

*Primary Examiner*—Paul T. Sewell
*Attorney, Agent, or Firm*—Scherlacher, Mok & Roth

[57] ABSTRACT

In a printer in which drive transistors coupled to hammer drive coils control energization of the coils within each of a plurality of magnetic print hammer actuators to provide firing of hammer springs associated with the print hammer actuators, leakage of one or more of the drive transistors when they are switched off is detected by a testing circuit which flags a fault condition to turn off the driver circuits if the current at a junction common to all of the drive transistors exceeds a predetermined threshold value. This provides an early warning system in which faulty transistors are routinely detected well before they have a chance to fail and thereafter burn out the associated coil included within a hammerbank of the printer. The testing circuit which comprises a resistor and an operational amplifier coupled in parallel between the common junction and a power supply terminal is activated by a transistor switch which responds to a test control microprocessor to repeatedly close and thereby test for transistor leakage as well as possible shorted coils when the printer is not printing. The microprocessor also repeatedly sequences through the drive transistors to momentarily switch each of them on so that the testing circuit can determine that they and the associated hammer drive coils conduct properly by insuring that a current of predetermined minimum value is present at the common junction. A power transistor coupled to provide rapid current rise when the drive transistors are switched on is also tested for leakage using a second testing circuit, when the printer is not printing.

14 Claims, 3 Drawing Sheets

MAGNETIC PRINT HAMMER ACTUATOR PROTECTION CIRCUIT

BACKGROUND OF THE INVENTION

1. Field of the Invention

The present invention relates to printers in which magnetic print hammer actuators associated with different hammer springs and containing hammer drive coils have drive transistors coupled to energize the hammer drive coils to provide selected firing of the hammer springs to effect printing, and more particularly to circuits for detecting fault conditions within the magnetic print hammer actuators and including particularly the drive transistors thereof.

2. History of the Prior Art

Printers are known in which hammer drive coils within magnetic print hammer actuators are selectively energized to provide release or firing of associated hammer springs to effect impact printing. An example of such a printer is provided by U.S. Pat. No. 3,941,051 of Barrus et al., PRINTER SYSTEM, which patent issued Mar. 2, 1976 and is commonly assigned with the present application.

In the printer described in the Barrus et al. patent, each of a plurality of hammer springs mounted along the length of an elongated hammerbank is normally held in a retracted position by a different magnetic print hammer actuator associated therewith. Each magnetic print hammer actuator includes a permanent magnet and a pole piece which form a portion of a magnetic path together with the hammer spring. An upper end of the hammer spring is held against the pole piece by the permanent magnet when in the retracted position. Each magnetic print hammer actuator also includes a magnetic coil mounted on the pole piece adjacent the free upper end of the associated hammer spring. Momentary energization of the magnetic coil overcomes the effects of the permanent magnet and causes the upper free end of the hammer spring to fly away from the pole piece so that a dot printing impact tip mounted thereon impacts a length of ink ribbon against a print paper. The hammer spring then rebounds back into the retracted position against the pole piece where it is held by the permanent magnet in preparation for tee next release or firing of the hammer spring by energizing the magnetic coil.

In printers of the type described in the Barrus et al. patent, the various magnetic hammer drive coils which are mounted on pole pieces along the length of the hammerbank so as to form a part of the hammerbank are coupled by wire busses to circuits located adjacent to but separate from the reciprocating hammerbank within the printer. The circuits include a plurality of drive transistors, each of which is normally switched off and is coupled to be switched on momentarily so as to energize an associated one of the hammer drive coils on the hammerbank when the hammer spring associated with that coil is to be fired. As is true of practically any electrical circuit, the drive transistors are not without their occasional reliability problems. Occasionally, one or more of the drive transistors will begin leaking and then eventually short circuit when switched off, or they will assume an open circuit condition and fail to properly energize the associated magnetic coil when switched on. The magnetic coils themselves will occasionally short or become open circuited.

Because of the occasional failures that may occur with the drive transistors or the hammer drive coils, it has become common practice to provide printers of this type with a detection circuit in an attempt to detect and signal failures of the drive transistors or the hammer drive coils. An example of such a detection circuit is provided by U.S. Pat. No. 4,405,922 of Nishino et al., FAILURE DETECTION CIRCUIT FOR IMPACT PRINTERS OR THE LIKE, which patent issued Sept. 20, 1983. The Nishino et al. patent describes a detection circuit in which the drive transistors and the associated hammer drive coils of the printer may be tested either during actual printing or when the printer is simply turned on but is not printing. As each drive transistor is turned on, a signal condition within a circuit associated therewith is sensed and then passed to a logic circuit together with information indicating that switching of the transistor has occurred. If a drive transistor has been switched on but fails to properly energize the associated hammer drive coil to provide hammer release, this error condition is signalled by the circuit.

Detection circuits such as that described in the Nishino et al. patent are generally effective in providing an indication when a component such as a drive transistor or a hammer drive coil has completely failed. However, such circuits do not provide an early warning of component failure which is important in taking quick action to minimize the consequential damage and losses that result therefrom. For example, the failure process for a drive transistor may take several minutes or longer to occur. However, once such transistor shorts out, it is usually less than a minute before the associated hammer drive coil on the hammerbank burns out. While the drive transistor typically forms a part of a circuit card which is relatively inexpensive and is easily replaced within the printer, the associated hammer drive coil forms a part of the hammerbank which is quite expensive and which is not very easily replaced. While the hammerbank contains many hammer drive coils, the burnout of merely one coil requires removal and repair of the hammerbank. Repair of the burned out coil is tedious and time-consuming, and the removal or replacement of the hammerbank must usually be done by a trained technician having specialized tooling.

It will therefore be appreciated that early detection of drive transistor failure is highly desirable. At the same time, it would be desirable to provide an improved circuit of relatively simple design for detecting open circuited as well as shorted conditions of the drive transistors as well as open and shorted conditions of the magnetic coils. It would furthermore be desirable to simplify the detection circuitry to the extent that the fault detecting portions thereof can be easily and simply coupled to common junctions within the circuitry of the magnetic print hammer actuators for the hammerbank.

BRIEF SUMMARY OF THE INVENTION

The foregoing and other objects and features in accordance with the invention are accomplished by providing a improved magnetic print hammer actuator protection circuit for use with a printer having a plurality of magnetic print hammer actuators in which hammer drive magnetic coils are energized using drive transistors.

Protection circuits in accordance with the invention provide early warning of drive transistor and other component failure by repeatedly monitoring the drive transistors for possible leakage when the drive transistors are switched off and the printer is not printing. This is readily accomplished by sensing current at a junction common to all of the drive transistors and the hammer drive coils associated therewith. Should one or more of the drive transistors begin leaking enough to produce a current at the common junction exceeding a predetermined threshold value, a testing circuit which is coupled to the common junction produces a fault signal. Such fault signal is coupled to provide removal of power to the driver circuits before the leaky drive transistor or transistors have a chance to fail completely and burn out the associated hammer drive coils. Such arrangement is also effective in detecting a coil which has become shorted to the frame. This also results in the generation of the fault signal.

The protection circuit according to the invention also insures that the drive transistors and associated hammer drive coils are capable of firing the hammers when the drive transistors are switched on. With the printer turned on but not printing, the various drive transistors are periodically switched on long enough to test their ability and the ability of the associated hammer drive coils to conduct sufficient current to be capable of firing the associated hammer springs. At the same time the drive transistors are not switched on long enough to actually fire the associated hammer springs. The drive transistors are momentarily switched on in sequence. Simultaneously with the turning on of each drive transistor, the common junction is monitored by a testing circuit to insure that a current of at least predetermined minimum value appears thereat. A current of any lesser value results in the testing circuit generating a fault signal to indicate either that the switched on drive transistor is not conducting properly or that the associated hammer drive coil is open circuited.

In accordance with the invention, a power transistor coupled to speed the current rise in the drive transistors is also monitored for leakage when switched off to provide an early indication of he possible failure thereof. A testing circuit similar to that used in conjunction with the drive transistors is coupled to the power transistor. This second testing circuit provides a fault signal if a current greater than a threshold value is present after the power transistor has been switched off.

In a preferred arrangement utilizing a protection circuit in accordance with the invention, the serial combinations of the various drive transistors and the hammer drive coils associated therewith are coupled in parallel between a first power supply terminal and a common terminal defining a common junction for the various drive transistors and the various hammer drive coils. A drive transistor testing circuit is coupled between the common terminal and a second power supply terminal and includes a resistor having an operational amplifier coupled in parallel therewith and a transistor switch serially coupled with the resistor.

With the printer turned on but not printing, a test control microprocessor coupled to the transistor switch repeatedly switches on the transistor switch momentarily. With all of the drive transistors switched off, no current should flow at the common junction. If one or more of the drive transistors leak when switched off, a current appears at the common junction and this produces a voltage drop at the resistor which is sensed by the operational amplifier. If the current sensed by the operational amplifier exceeds a predetermined threshold value indicating that at least one of the drive transistors is likely to fail or that one or more of the hammer drive coils may be short circuited to the frame or to the power supply, the operational amplifier produces a fault signal. The fault signal is provided to power supplies for the printer to remove power to the driver circuits. The printer remains immobilized until the circuit can be tested and repaired or replaced.

In addition to periodically examining the drive transistors for leakage when such transistors are switched off, the circuit is also periodically examined to insure that the drive transistors and the associated hammer drive coils are capable of firing the hammer springs. Periodically, the test control microprocessor momentarily switches each of the drive transistors on in sequence. As each drive transistor is switched on, the switching transistor within the drive transistor testing circuit is also switched on so that the operational amplifier can examine current conditions at the common junction. If each drive transistor and its associated hammer drive coil are operating properly, the switching on of such transistor will result in a current of at least predetermined minimum value at the common junction. The operational amplifier senses the value of the current at the common junction and provides a fault signal if such current value is less than the minimum acceptable value. The fault signal provides a message to the operator of the printer.

During printing, a power transistor which is coupled between the second power supply terminal and the common junction is switched on at the beginning of each hammer firing cycle to speed the current rise in those drive transistors which are switched on at the beginning of the cycle. When the printer is not printing, the power transistor is repeatedly examined for leakage by a power transistor testing circuit. The serial combination of a resistor and a switching transistor is coupled between the common junction and the power supply so that when the switching transistor is periodically switched on momentarily by the test control microprocessor, any conduction of the switched off power transistor will provide a voltage drop across the resistor. An operational amplifier coupled in parallel with the resistor provides a fault signal if the leakage current through the power transistor exceeds a predetermined threshold value. The fault signal is applied to provide a warning that the power transistor is malfunctioning.

BRIEF DESCRIPTION OF THE DRAWINGS

The foregoing and other objects, features and advantages of the invention will be apparent from the following more particular description of preferred embodiments of the invention, as illustrated in the accompanying drawings, in which.

DETAILED DESCRIPTION

Figure 1:
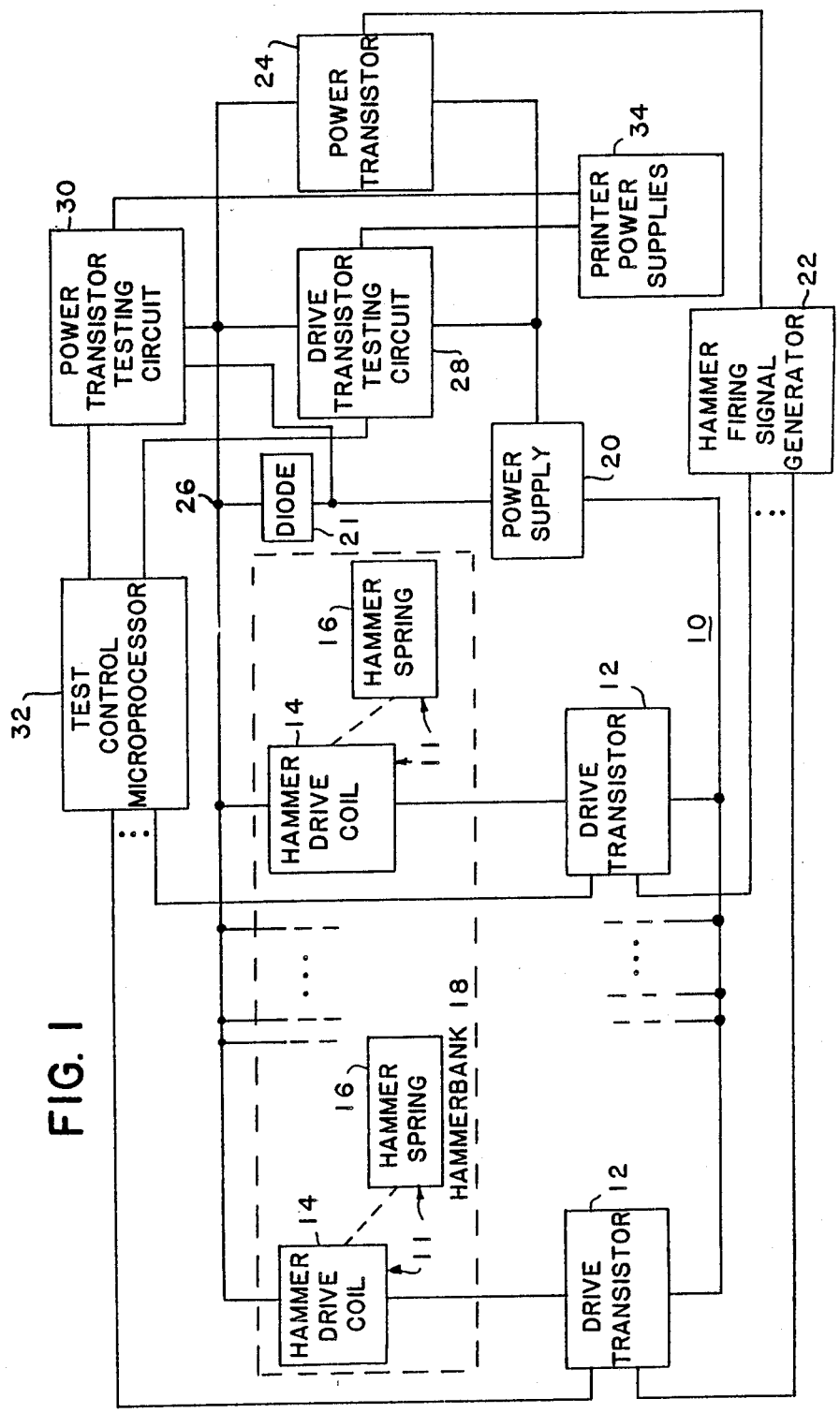
FIG. 1 is a block diagram of an arrangement of magnetic print hammer actuators which includes protection circuits in accordance with the invention.

FIG. 1 depicts a hammer actuator arrangement 10 comprised of a plurality of magnetic print hammer actuators 11 and having protection circuits in accordance with the invention. The hammer actuator arrangement 10 includes a plurality of drive transistors 12, each of which is associated with a different magnetic print hammer actuator 11 and is coupled to a hammer drive coil 14 within the magnetic print hammer actuator 11. Each hammer drive coil 14 is coupled to release or "fire" an associated hammer spring 16. The hammer springs 16 are mounted along the length of a hammerbank 18 in conventional fashion, which hammerbank 18 includes the hammer drive coils 14.

The hammerbank 18 typically includes a relatively large number of the hammer springs 16 such as 33, 66 or 88 springs depending on the design of the hammerbank 18 and the requirements of the printer of which the hammerbank 18 forms a part. Only two of the hammer drive coils 14 and the hammer springs 16 associated therewith are shown in FIG. 1 for simplicity of illustration. Likewise, only two of the drive transistors 12 are shown in FIG. 1.

Each hammer drive coil 14 and the drive transistor 12 associated therewith form a serial combination within a given one of the magnetic print hammer actuators 11. The serial combinations of the hammer drive coils 14 and the associated drive transistors 12 are coupled in parallel across the serial combination of a power supply 20 and a diode 21. As is known in the art and as described 10 in the previously referred to U.S. Pat. No. 3,941,051 of Barrus et al., selected ones of the hammer springs 16 are fired at the beginning of each of a succession of firing cycles as the hammerbank 18 is moved back and forth across a length of print paper in reciprocating fashion. A hammer firing signal generator 22 provides signals at the start of each firing cycle denoting those hammer springs 16 which are to be fired. These signals are applied to the drive transistors 12 of the hammer spring 16 to be fired. The signals switch on the drive transistors 12 so that the associated hammer drive coils 14 are energized long enough to effect firing of the associated hammer springs 16. Each hammer spring 16 contains a dot printing impact tip which impacts a length of ink ribbon against the print paper to form a dot when the hammer spring 16 is fired. Following formation of the dot, the hammer spring 16 returns to a retracted position in readiness for the next firing thereof in response to signals from the hammer firing signal generator 22.

The signals from the hammer firing signal generator 22 which are applied to switch on selected ones of the drive transistors 12 at the beginning of each firing cycle are operative to hold the drive transistors 12 switched on for 200-220 microseconds before the drive transistors 12 are switched off. This is a sufficient amount of time to energize the hammer drive coils 14 associated with the switched on drive transistors 12 to effect firing of the associated hammer springs 16. In order to produce a rapid current rise in those drive transistors 12 which are switched on, a power transistor 24 is provided. The power transistor 24 is coupled across the serial combination of the power supply 20 and the diode 21 such that one side of the power transistor is coupled to a junction 26 on the opposite side of the diode 21 from the power supply 20. The junction 26 is common to the various serial combinations of drive transistors 12 and hammer drive coils 14. At the beginning of each hammer firing cycle, the hammer firing signal generator 22 switches on the power transistor 24 for 65-75 microseconds. This is long enough to provide the desired rapid increase of current flow through those drive transistors 12 which are switched on.

The hammer actuator arrangement 10 of FIG. 1 is capable of experiencing a number of fault conditions due to failure of the drive transistors 12 and the hammer drive coils 14. The hammer drive coils 14 may fail to operate properly such as where the coil 14 becomes shorted to the frame of the hammerbank 18 or, perhaps more commonly, becomes open circuited so that it fails to respond to the switching on of the associated drive transistor 12 to provide firing of the associated hammer spring 16. More commonly, however, the drive transistors 12 fail. A drive transistor 12 may respond to a signal from the hammer firing signal generator 22 by conducting insufficiently or not at all. As a result the associated hammer drive coil 14 is not properly energized and the hammer spring 16 is not fired. Alternatively, and perhaps more seriously, the drive transistor 12 may begin to leak when it is switched off. Typically, a drive transistor 12 will begin leaking for a period of several minutes or more before it fails. When the transistor 12 fails, it typically short circuits so as to continuously couple the associated hammer drive coil 14 across the power supply 20. This usually results in burnout of the hammer drive 14 some 30-45 seconds later. The power transistor 24 can also malfunction by leaking when it is switched off.

To test for the various fault conditions described, the magnetic hammer actuator circuit 10 is provided with a drive transistor testing circuit 28 and a power transistor testing circuit 30. Each of the testing circuits 28 and 30 is coupled to the common junction 26 and is controlled by a test control microprocessor 32. The drive transistor testing circuit 28 is periodically activated by the test control microprocessor 32 when the printer is not printing in order to examine the operation of the drive transistors 12 and the hammer drive coils 14. Leakage of the drive transistors 12 is detected as well as the inability of the drive transistors 12 and the associated hammer drive coils 14 to properly fire the associated hammer springs 16. The test control microprocessor 32 also periodically activates the power transistor testing circuit 30 when the printer is not printing. Each time the power transistor testing circuit 30 is activated, the power transistor 24 which is switched off is examined for leakage.

As previously noted, one fault condition is characterized by energization of a hammer drive coil 14 when the associated drive transistor 12 is switched off. This can result from the hammer drive coil 14 being shorted, but more commonly is the result of leakage of the drive transistor 12. Typically, a drive transistor 12 will leak for a period of several minutes or longer before it fails. While leakage of the drive transistor 12 results in some energization of the drive coil 14, this is usually not enough to burn out the hammer drive coil 14 until the drive transistor 12 completely fails so as to become effectively short circuited.

It is therefore highly advantageous to provide an early warning system which senses leakage of the drive transistors 12 long before they completely fail, and this is accomplished by the drive transistor testing circuit 28. The drive transistor testing circuit 28 periodically examines current conditions at the common junction 26 under control of the test control microprocessor 32. If current at the common junction 26 with all of the drive transistors 12 switched off is determined by the drive transistor testing circuit 28 to exceed a predetermined threshold value, a fault signal is provided to various printer power supplies 34 which results in removal of power to the driver circuits. The threshold current value at the common junction 26 is set so that a fault signal is generated if even one of the drive transistors 12 begins to leak significantly. The test control microprocessor 32 activates the drive transistor testing circuit 28 to perform this testing approximately 10-20 times per second when the printer is turned on but is not printing.

At the same time as the drive transistor testing circuit 28 is periodically activated by the test control microprocessor 32 when the printer 10 is not printing, the power transistor testing circuit 30 is activated by the test control microprocessor 32 approximately 20-50 times per second. Each time the power transistor testing circuit 30 is activated, it examines the common junction 26 for the presence of a current from the power transistor 24. With the power transistor 24 switched off, no current should flow therethrough to the common junction 26. If the power transistor testing circuit 30 detects a current from the power transistor 24 at the common junction 26 of greater than a predetermined threshold value, a fault signal is provided to the printer power supplies 34. This fault signal provides a warning signal at the control panel of the printer indicating that the power transistor 24 is malfunctioning.

As previously noted, the drive transistor testing circuit 28 also tests for proper conduction of the drive transistors 12 and the hammer drive coils 14 when the printer is not printing. At a frequency of at least once per second, the test control microprocessor 32 switches on each of the drive transistors 12 in sequence and simultaneously activates the drive transistor testing circuit 28. Each of the drive transistors 12 is switched on for a period of approximately 20 microseconds which is long enough to test for proper conduction thereof but not long enough to fire the associated hammer spring 16. In this manner the drive transistors 12 and the hammer drive coils 14 can be tested without the need for printing and the resultant wastage of print paper. Approximately 15 microseconds after each drive transistor 12 is switched on and the drive transistor testing circuit 28 is activated, the drive transistor testing circuit 28 examines the current conditions at the common junction 26. If the switched on drive transistor 12 and its associated hammer drive coil 14 are operating properly, a current of at least predetermined minimum value will appear at the common junction 26. A current of any lesser value results in the drive transistor testing circuit 28 providing a fault signal to the printer power supplies 34.

Figure 2:
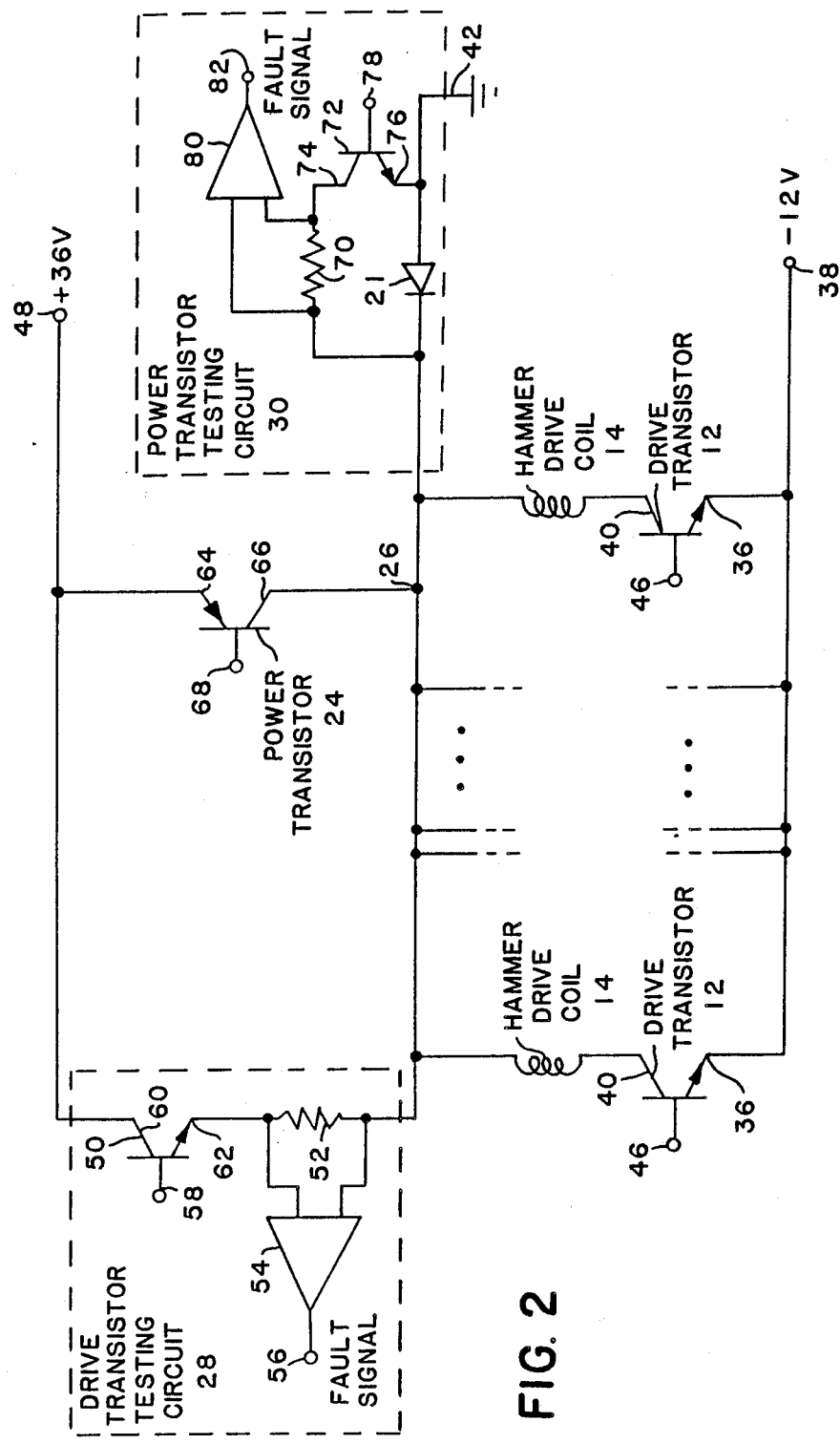
FIG. 2 is a simplified schematic diagram of portions of the arrangement of FIG. 1.

FIG. 2 is a basic schematic diagram of portions of the hammer actuator arrangement 10 of FIG. 1 and illustrating the drive transistor testing circuit 28 and the power transistor testing circuit 30 in some detail. As shown in FIG. 2 each drive transistor 12 has an emitter terminal 36 thereof coupled to a first power supply terminal 38 of the power supply 20 shown in FIG. 1. The first power supply terminal 38 has a voltage of −12 volts. Each drive transistor 12 has a collector terminal 40 thereof coupled to an associated one of the hammer drive coils 14. The opposite side of each hammer drive coil 14 is coupled to the common junction 26 which in turn is coupled to a grounded common terminal 42 of the power supply 20 through the diode 21.

Each of the drive transistors 12 has a base terminal 46 which controls the switching on and off of the drive transistor 12. The base terminals 46 of the drive transistors 12 are coupled to the hammer firing signal generator 22 shown in FIG. 1 as well as to the test control microprocessor 32 shown in FIG. 1. Each drive transistor 12 is normally switched off. When the hammer spring 16 associated therewith is to be fired, the hammer firing signal generator 22 provides a signal at the base terminal 46 to bias the drive transistor 12 into conduction. The drive transistor 12 as so switched on energizes the associated hammer drive coil 14 to fire the associated hammer spring 16.

As previously noted, the various drive transistors 12 are sequentially examined at least once per second when the printer is not printing to determine if each drive transistor 12 and the associated hammer drive coil 14 are capable of firing the associated hammer spring 16. When this occurs, each drive transistor 12 is momentarily biased into conduction or switched on by application of a signal to the base terminal 46 thereof from the test control microprocessor 32.

The power supply 20 includes a second power supply terminal 48 at which +36 volts is provided. The drive transistor testing circuit 28 which is coupled between the second power supply terminal 48 and the grounded common terminal 42 includes the serial combination of a transistor switch 50 and a resistor 52. When the transistor switch 50 is switched on, the resistor 52 experiences a voltage drop thereacross proportional to the amount of current flowing at the common junction 26. This voltage drop is sensed by an operational amplifier 54 coupled in parallel with the resistor 52. The operation amplifier 54 has an output terminal 56 for providing a fault signal to the printer power supplies 34.

As previously noted, the test control microprocessor 32 examines the drive transistors 12 and the hammer drive coils 14 for leakage approximately 10-20 times per second. Each such examination is initiated by the test control microprocessor 32 which provides a signal to a base terminal 58 of the transistor switch 50 to switch the transistor switch 50 on for a brief interval. The transistor switch 50 which has a collector terminal 60 thereof coupled to the second power supply terminal 48 and an emitter terminal 62 thereof coupled to the resistor 52 passes a current through the resistor 52 in proportion to the amount of current at the common junction 26 due to conduction of the drive transistors 12 and the hammer drive coils 14. The drive transistors 12 are switched off so that no current should appear at the common junction 26. However, if one or more of the drive transistors 12 are leaking, a current will appear at the common junction 26. If this current exceeds a predetermined threshold value, the voltage drop across the resistor 52 is sufficient to cause the operational amplifier 54 to generate the fault signal at the output terminal 56 thereof. In the present example, the threshold value is 40 milliamperes. Significant leakage of even one of the drive transistors 12 will result in a current at the common junction 26 of more than 40 milliamperes. By the same token if all of the drive transistors 12 are functioning properly, the extremely small amounts of leakage current that can normally result therefrom will not total up to 40 milliamperes.

By testing the current condition at the common junction 26, the drive transistor testing circuit 28 is able to detect a potentially dangerous fault condition in a relatively simple and economic manner. While termination of printing due to the appearance of a fault signal at the upper terminal 56 does not indicate which one or ones of the drive transistors 12 are malfunctioning, it does serve the highly useful purpose of preventing one or more of the hammer drive coils 14 from burning out. Typically, the various drive transistors 12 are contained within a single printed circuit card, so that the entire circuit card is simply replaced when a fault condition is indicated. Burnout of one or more of the hammer drive coils 14 on the other hand typically requires replacement of the entire hammerbank 18. As previously noted, replacement of the hammerbank 18 is difficult enough, and replacement of burned out hammer drive coils 14 thereon is difficult and expensive.

As previously noted each of the drive transistors 12 and the associated hammer drive coil 14 are examined in sequence at least once each second to determine their ability to properly fire the associated hammer spring 16. This sequential examination is accomplished by applying a signal from the test control microprocessor 32 to sequentially switch on each drive transistor 12 momentarily. At the same time, the transistor switch 50 is momentarily switched on or closed by application of a signal to the base terminal 58 from the test control microprocessor 32. Under the control of the test control microprocessor 52, the operational amplifier 54 examines current conditions at the common junction 26 approximately 10-15 microseconds later. If the drive transistor 12 and the associated hammer drive coil 14 are functioning properly, a current of at least predetermined minimum acceptable value will appear at the common junction 26 and the requirements of the operational amplifier 54 will be satisfied. Otherwise, the operation amplifier 54 generates a fault signal at the output terminal 56 thereof. The test control microprocessor 32 examines the drive transistors 12 and the hammer drive coils 14 in sequence by sequentially switching on each of the drive transistors 12 in synchronism with closure of the transistor switch 50. The drive transistor 12 is switched on long enough to produce a current at the common junction 26 indicating proper operation of the drive transistor 12 and the hammer drive coil 14 but not long enough to actually fire the hammer spring 16 associated with the hammer drive coil 14.

As previously noted the power transistor testing circuit 30 periodically examines the power transistor 24 for leakage when the printer is not printing. The power transistor 24 has an emitter terminal 64 coupled to the second power supply terminal 48 and a collector terminal 66 coupled to the grounded common terminal 42 of the power supply 20 through the common junction 26 and the diode 21. A base terminal 68 of the power transistor 24 is coupled to the hammer firing signal generator 22 of FIG. 1 which biases the power transistor 24 into conduction so as to switch it on at the beginning of each hammer firing cycle.

The power transistor testing circuit 30 includes the serial combination of a resistor 70 and a transistor switch 72 coupled in parallel with the diode 21 so as to be coupled between the common junction 26 and the grounded common terminal 42. The transistor switch 72 has a collector terminal 74 thereof coupled to the resistor 70 and an emitter terminal 76 thereof coupled to the grounded common terminal 42. The base terminal 78 of the transistor 72 is coupled to receive periodic signals from the test control microprocessor 32 which bias the transistor switch 72 into conduction or switch it on momentarily in order to test the power transistor 24 for leakage. As previously noted, this is done 20-50 times per second.

With the power transistor 24 switched off, it should not conduct. However, if the power transistor 24 is leaking, then a voltage drop appears across the resistor 70 and is sensed by an operational amplifier 80. If the leakage current exceeds a predetermined threshold value, the operational amplifier 80 responds by producing a fault signal at an output terminal 82 thereof. As previously noted, this fault signal results in a warning signal being provided at the control panel of the printer 10.

Figure 3:
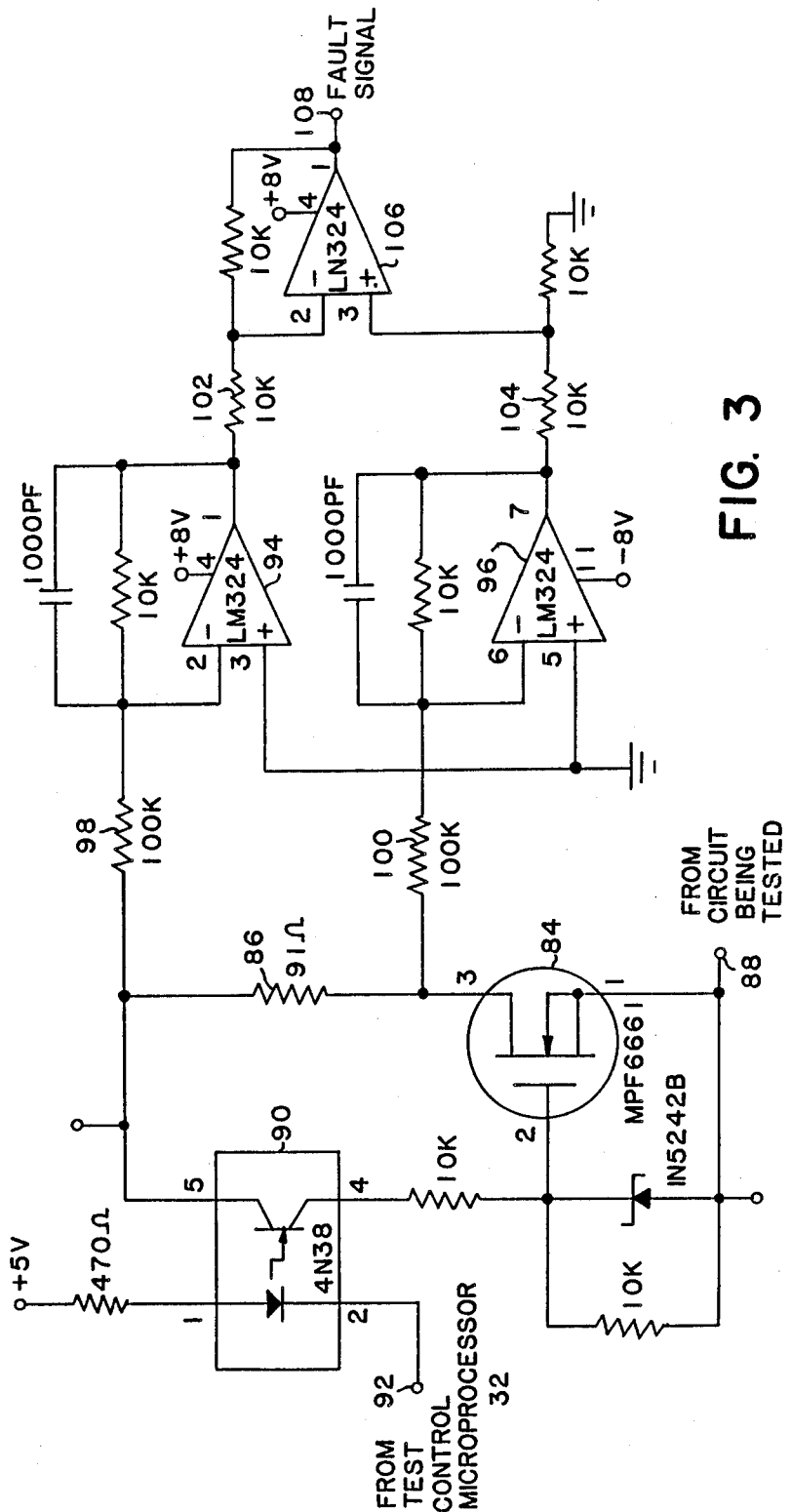
FIG. 3 is a detailed schematic diagram of one of the testing circuits of the arrangement of FIG. 1.

The drive transistor testing circuit 28 and the power transistor testing circuit 30 are of like configuration, and a detailed example that can be used for either is shown in FIG. 3. In the particular arrangement of FIG. 3 an MPF6661 FET 84 functions as either the transistor switch 50 or the transistor switch 72 depending upon whether the circuit of FIG. 3 is functioning as the drive transistor testing circuit 28 or the power transistor testing circuit 30. A resistor 86 corresponds to either the resistor 52 of the drive transistor testing circuit 28 o the resistor 70 of the power transistor circuit 30. The FET 84 and the resistor 86 are coupled between the +36 volt second power supply terminal 48 and the common junction 26, in the case of the drive transistor testing circuit 28. The FET 84 and the resistor 86 are coupled between the common junction 26 and the common terminal 42, in the case of the power transistor testing circuit 30.

Control of the FET 84 in response to the test control microprocessor 32 is accomplished using a 4N38 circuit 90 having the number 2 terminal thereof coupled to a terminal 92 to receive signals from the test control microprocessor 32. The circuit 90 is present to provide isolation of the circuit 84 and the resistor 86 from the test control microprocessor 32.

The operational amplifier 54 of the drive transistor testing circuit 28 (or the operational amplifier 80 in the case of the power transistor testing circuit 30) is provided by a pair of LM324 circuits 94 and 96 in the example of FIG. 3. The circuits 94 and 96 respectively have input terminal numbers 3 and 5 thereof coupled to ground. The input terminal numbers 2 and 6 of the circuits 94 and 96 respectively are coupled to opposite ends of the resistor 86 through resistors 98 and 100 respectively. Output terminal numbers 1 and 7 of the circuits 94 and 96 respectively are coupled through resistors 102 and 104 to the number 2 and number terminals of a third LM324 circuit 106. The number 1 terminal of the LM324 circuit 106 is coupled to an output terminal 108 to provide the fault signal.

When the circuit arrangement shown in FIG. 3 is used as the drive transistor testing circuit 28, the signals representing excessive leakage through the drive transistors 12 or insufficient current at the common junction 26 with any one of the drive transistors 12 switched on appear as a voltage drop across the resistor 86. The LM324 circuits 94, 96 and 106 respond to this condition to produce a fault signal at the output terminal 108.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a printer having a common power transistor, a circuit for detecting a failure condition of the common power transistor comprising means for sensing conductivity of the common power transistor and means for signaling a failure condition when the common power transistor is switched off and at the same time begins to conduct at a level signifying abnormal operation, the printer including a plurality of drive transistors for driving a plurality of print hammer actuators and the common power transistor being coupled to provide rapid current rise in each of the drive transistors when the drive transistors are switched on.

2. An arrangement for driving a plurality of hammer actuators in a printer, each of the hammer actuators including a different hammer drive coil, comprising the combination of a plurality of drive transistors, each coupled to drive a different one of the plurality of hammer actuators and coupled to the hammer drive coil thereof, a common junction, a common power transistor which is normally switched off coupled to the plurality of drive transistors through the common junction to provide rapid current rise therein when switched on, and a testing circuit coupled to the common power transistor and operative to provide a fault signal when the common power transistor is switched off and begins to conduct above a threshold value signifying abnormal current leakage.

3. The invention set forth in claim 2, wherein the common power transistor is coupled to a power supply and the testing circuit includes a resistor coupled between the common power transistor and the power supply and an operational amplifier coupled in parallel with the resistor and operative to provide the fault signal.

4. The invention set forth in claim 3, further including a switch coupled in series with the resistor and means for repeatedly turning the switch on momentarily to test the common power transistor when the printer is not printing.

5. The invention set forth in claim 4, wherein the switch comprises a switching transistor and the means for repeatedly turning the switch on momentarily comprises a microprocessor coupled to the switching transistor.

6. An arrangement for driving a plurality of hammer actuators in a printer, each of the hammer actuators including a different hammer drive coil, comprising the combination of a plurality of drive transistors each coupled to a different hammer drive coil and to a common junction, a testing circuit coupled to the common junction and operative to provide a fault signal when at least one of the plurality of drive transistors is operating improperly and means for momentarily turning on each of the drive transistors in sequence, and wherein the testing circuit is operative to provide a fault signal in response to the momentary turning on of each of the drive transistors if a current of at least predetermined threshold value does not appear at the common junction.

7. An arrangement for driving a plurality of hammer actuators in a printer, each of the hammer actuators including a different hammer drive coil, comprising the combination of a first power supply terminal, a common terminal, a common junction, a diode coupled between the common terminal and the common junction, a plurality of drive transistors each coupled to a different hammer drive coil to form a plurality of serially coupled combinations of a drive transistor and a hammer drive coil, means coupling the serially coupled combinations in parallel between the first power supply terminal and the common junction, a second power supply terminal, a testing circuit, and means for coupling the testing circuit between the second power supply terminal and the common junction.

8. The invention set forth in claim 7, wherein the testing circuit includes a resistor coupled between the second power supply terminal and the common junction and an operational amplifier coupled in parallel with the resistor.

9. The invention set forth in claim 8, further including a power transistor coupled between the second power supply terminal and the common junction in parallel with the testing circuit.

10. The invention set forth in claim 9, further including a second testing circuit coupled between the power transistor and the common terminal and operative to test the power transistor.

11. The invention set forth in claim 8, further including a switch coupled in series with a resistor between the second power supply terminal and the common junction and means for repeatedly turning the switch on momentarily to test the drive transistors for leakage when the drive transistors are switched off and the printer is not printing.

12. The invention set forth in claim 8, further including a switch coupled in series with the resistor between the second power supply terminal and the common junction, and means for momentarily turning on each of the drive transistors in sequence and closing the switch when the printer is not printing.

13. The invention set forth in claim 8, further including a switching transistor coupled in series with the resistor between the second power supply terminal and the common junction, and a microprocessor coupled to operate the switching transistor and operative to repeatedly close the switching transistor momentarily when the printer is not printing.

14. The invention set forth in claim 13, wherein the microprocessor is also coupled to each of the drive transistors and is operative to momentarily switch each of the drive transistors on in sequence and to simultaneously close the switching transistor when the printer is not printing.

* * * * *